(12) United States Patent
Wong

(10) Patent No.: US 6,259,627 B1
(45) Date of Patent: Jul. 10, 2001

(54) READ AND WRITE OPERATIONS USING CONSTANT ROW LINE VOLTAGE AND VARIABLE COLUMN LINE LOAD

(75) Inventor: Sau Ching Wong, Hillsborough, CA (US)

(73) Assignee: Multi Level Memory Technology, Cupertino, CA (US)

(*) Notice: Subject to any disclaimer, the term of this patent is extended or adjusted under 35 U.S.C. 154(b) by 0 days.

(21) Appl. No.: 09/493,026

(22) Filed: Jan. 27, 2000

(51) Int. Cl.⁷ .................................................. G11C 16/06
(52) U.S. Cl. .............................. 365/185.21; 365/185.22; 365/185.03; 365/185.29
(58) Field of Search .................... 365/185.21, 185.22, 365/185.03, 185.19

(56) References Cited

U.S. PATENT DOCUMENTS

| | | |
|---|---|---|
| 5,680,341 | 10/1997 | Wong et al. . |
| 5,694,356 | 12/1997 | Wong et al. . |
| 5,748,533 | 5/1998 | Dunlap et al. . |
| 5,748,534 | 5/1998 | Dunlap et al. . |
| 5,815,439 * | 9/1998 | Korsh et al. ................. 365/185.03 X |
| 5,969,986 | 10/1999 | Wong et al. . |
| 6,038,166 | 3/2000 | Wong . |
| 6,097,638 * | 8/2000 | Himeno et al. ............. 365/185.21 X |
| 6,134,141 | 10/2000 | Wong . |

* cited by examiner

*Primary Examiner*—Huan Hoang
(74) *Attorney, Agent, or Firm*—David T. Millers

(57) ABSTRACT

A read operation for a multi-level or a multi-bit-per-cell non-volatile memory biases a selected row line cell at a fixed voltage that is above the maximum possible threshold voltage representing data and changes the column line load for a selected column line. The column line load that corresponds to the trip-point of a sense amplifier indicates the data stored in the memory cell coupled to the selected row and column lines. A corresponding write process uses the same fixed row line voltage for both program and verify cycles. The programming voltage can be the same as the row line voltage for the read operation or can depend on the data value being written. To better control programming, the duration of the program cycles and/or the load on the drain or source of the selected memory cell during a program cycle varies with time and depends on the value being written. One memory in accordance with the invention includes variable column line loads for use during read and write operations. The variable loads can select the programming current for the write operation or the bias for the read operation according to a data value and/or a count. A counter generating the count for the variable loads can be used during a read operation to change the column line bias until the trip-point of a sense amplifier is found and during a write operation to reduce programming current when the threshold voltage of the selected memory cell nears the target threshold voltage level.

28 Claims, 10 Drawing Sheets

READ AND WRITE OPERATIONS USING CONSTANT ROW LINE VOLTAGE AND VARIABLE COLUMN LINE LOAD

BACKGROUND

1. Field of the Invention

This invention relates to multi-level non-volatile semiconductor memory and to access methods that reduce fluctuations in a row line voltage during reading from or writing to a multi-level or multi-bit memory cell.

2. Description of Related Art

Multi-level semiconductor memory devices store an analog value or multiple bits of information in each memory cell. Conventionally, the threshold voltage of a floating gate transistor in a memory cell indicates the value or information stored in the memory cell. Accordingly, storing and retrieving several bits of information or an analog value with accuracy require precise methods for writing and reading the threshold voltage of the floating gate transistor.

One read operation for a multi-level memory varies the voltage on a row line that is attached to the control gate of a selected memory cell and senses the transition between a conductive and a non-conductive state of the selected memory cell. The transition occurs at a row line voltage that is about equal to the threshold voltage of the memory cell. U.S. Pat. Nos. 5,694,356; 5,748,534; and 5,748,533 describe some methods for reading a threshold voltage based on a memory cell's response to a varying row line voltage. For an analog memory, the transition voltage can be sampled and output as the result of the read operation. For a multi-bit-per-cell memory, that analog voltage can be converted to a digital value or alternatively a digital counter, which is synchronized with the changes in the row line voltage, can be stopped to provide a direct digital readout when a memory cell transits between the conductive and non-conductive states. U.S. patent application Ser. No. 09/053,716 describes multi-bit-per-cell memories using counters in the read circuits.

Variation of the row line voltage is also common during write operations. For example, one known write operation applies a high voltage to a row line during each of a series of program cycles. The high voltage on the row line combined with appropriate voltages on the source and drain of a selected memory cell changes the threshold voltage of the selected memory cell by a mechanism such as channel hot electron injection or Fowler-Nordheim tunneling. During a series of verify cycles, which are between program cycles, a write circuit drops the row line voltage to a level corresponding to the target threshold voltage of the write operation and then senses the conductivity of the selected memory cell. When one of the verify cycles senses a change in the conductivity of the selected memory cell, the threshold voltage has reached the target level, and the write operation is complete.

The read and write methods that vary the row line voltage have some disadvantages. In particular, the row lines for large memory arrays can have a relatively high capacitance. Accordingly, changing the row line voltage requires a relatively high current and a relatively large driver circuit. The row line voltages are typically high and require large charge pump circuits. Even with large drivers and charge pump circuits, the charging and discharging of a row line are subject to RC time delays. Further, the changes in the current create noise that can disturb the accuracy of the memory access. Additionally, read and write methods that vary the word line voltage according to a value being written or according to a result that a read operation generates are difficult to use for simultaneous accesses of two or more memory cells on the same row line. In particular, the change in the row line voltage for one memory cell being accessed may be inappropriate for access of another memory cell in the same row. Accordingly, implementing parallel read operations in a multi-level or multi-bit-per-cell array can be complicated.

A known read method that avoids changing the row line voltage applies a fixed voltage to the row line coupled to the selected cell and to a set of reference cells in the same row. The reference cells have different threshold voltages corresponding to the different values that can be stored in a memory cell. Each of the selected memory cell and the reference cells conducts a current that depends on the threshold voltage of the cell. A read circuit identifies the reference cell that has a current approximately equal to the current through the selected memory cell, and the value associated with the identified reference cell is the value read from the selected cell. This approach requires a number of reference cells that increases exponentially with the number of bits stored in each memory cell and linearly with the number of rows.

U.S. patent application Ser. No. 09/224,656 describes a write method that applies a programming voltage to a row line for programming cycles and maintains that same voltage during verify cycles. Instead of changing the row line voltage for the verify cycles, the write circuit selects a bias voltage and current for the column line coupled to the selected cell such that the programming voltage corresponds to the trigger point of a sense amplifier when the selected memory cell has the target threshold voltage. More specifically, when a column line bias circuit supplies a large current, a sense amplifier can sense current through the selected memory cell only if the current through the selected memory cell is correspondingly large. The row line voltage must be higher to achieve the large current through the selected memory cell. With the proper selection of column line bias current, the programming voltage on the row line is also the row line voltage required to trip the sense amplifier when the selected memory cell has the target threshold voltage.

Read and write methods still seek to avoid the noise and charging problems associated with changing the row line voltage, avoid the requirement of a large number of reference cells, and provide an accurate reading and writing of threshold voltages.

SUMMARY

In accordance with the invention, a read method biases the row line coupled to a selected cell at a voltage that is above the maximum possible threshold voltage of the selected memory. The read method then changes the bias applied to the column line coupled to the selected cell. When the column line bias has a low current capacity, a sense amplifier coupled to the selected bias line can sense a relatively small current through the selected memory cell. If the column line bias provides a high enough current, the sense amplifier can no longer sense the current through the selected memory cell. The read process changes the column line bias among a set of predetermined current levels, where each current level corresponds to an internally-used multi-bit digital value. The minimum bias current level at which the sense amplifier fails to trip (or the maximum bias current level at which the sense amplifier trips) indicates the internal multi-bit digital value corresponding to the threshold voltage of the selected cell. This internal multi-bit digital value can be converted to an output analog or multi-bit digital value.

A write process uses the same row line voltage for both program and verify cycles. The row line voltage either depends on the value being written or is independent of the value being written. In an embodiment where the row voltage for a write operation is independent of the value being written, the row line voltage can be the same for both read and the write operations so that the trip-points for the sense amplifiers during the verify cycles are the same as the trip-points during the read operations. The row line voltage being the same for both write and read operations also facilitates parallel read or write operations of multiple memory cells on the same row line. To better control programming, the duration of the program cycles or the column line load on the drain or source of the selected memory cell during a program cycle varies with time and depends on the analog or multi-bit digital value being written into the memory cell. Thus, the write operation is accurate because dynamically variable programming cycles cause smaller changes in the threshold voltage of a memory cell when a target threshold voltage for the write operation is low and when the threshold voltage of the memory cell nears the target threshold voltage.

In another embodiment of the invention, a write operation including program and verify cycles uses a row line voltage that depends on the value being written. The row line voltage for a read operation typically differs from the row line voltage used during the write operation. Accordingly, the column line bias for a verify operation at the trip-point of the sense amplifier differs from the column line bias for a read operation at the trip-point of the sense amplifier. A converter converts an m-bit digital value corresponding to the column line bias for the read operation to an n-bit read value where m is greater than n. The converter may include a content addressable memory (CAM) or other memory structure that is initialized by reading a set of reference cells and thereby determining a mapping between the m-bit digital values and the n-bit read value.

One memory architecture for the constant voltage read and write operations has segmented word lines to minimize the disturbance of unselected memory cells during the read and write operations. Two or more memory cells in the same segment can be simultaneously accessed for read or write operations, for example, to provide a data bandwidth greater than the number of bits stored in each memory cell.

One read operation in accordance with an embodiment of the invention includes: biasing a selected row line at a first voltage; connecting a sense amplifier to a selected column line; applying a selected load to the selected column line; and determining a state of the sense amplifier while the selected row line is at the first voltage and the selected load is applied to the selected column. The selected row line is coupled to a control gate of a selected memory cell, and the first voltage is higher than any threshold voltage used to represent data in the multi-level memory. In response to the sense amplifier having a first state, the read operation changes the selected load and repeats the applying and determining steps. In response to the sense amplifier having a second state, the read operation generates a read value according to the selected bias. In one embodiment, the first state of the sense amplifier arises when current through the selected memory cells trips the sense amplifier; and the second state arises when the current through the selected memory cells fails to trip the sense amplifier.

The first voltage, which is on a selected row line during a read operation, may be equal to a voltage applied to the selected row line when writing a data value. For example, the first voltage may be equal to the write voltage used when writing the data value corresponding to the lowest target threshold voltage for a write operation. The read operation can use the row line voltage used during the write operation when that voltage is independent of value being written.

A write operation applies programming pulses during program cycles and determines whether the selected memory cell has reached a target threshold voltage during verify cycles. In accordance with an aspect of the invention, an initial verify cycle can determine that the selected memory cell is at the target threshold voltage, but a second verify cycle is required to confirm that determination before the write operation ends. If the following verify cycle does not confirm the initial determination, the write operation performs another program cycle, and that program cycle includes a programming pulse having a minimum pulse-width and/or minimum programming current so that the threshold voltage changes minimally. The write operation only ends upon confirmation, for example, by one or more confirming verify cycles or one or more consecutive confirming verify cycles following the initial verify cycle indicating the write operation is finished.

Another embodiment of the invention is a multi-level memory that includes a memory array, a column decoder, a variable load between the column decoder and a source of a first voltage, and a counter coupled to the variable load. A count signal from the counter controls the variable load during a read or write operation. For example, a count from the counter is a control signal to the variable load. During a write operation, the changing count causes the variable load to decrease the programming current to decrease the change in threshold voltage per program cycle. Alternatively, the changing count causes the variable load to change the bias current until a current corresponding to the trip-point of a sense amplifier is found. The count then provides an internal multi-bit digital value that can be converted to an analog or multi-bit digital output value. As a variant of this embodiment, the memory can include two variable loads for connection to a selected column line during read or write operations. One variable load uses a write voltage and provides a programming current. The other variable load uses a lower voltage and biases column lines for sensing operations during read operations and the verify cycles of write operations.

BRIEF DESCRIPTION OF THE DRAWINGS

Use of the same reference symbols in different figures indicates similar or identical items.

DETAILED DESCRIPTION

In accordance with an aspect of the invention, read and write processes for a non-volatile multi-level memory use constant row line voltages and variable column line loads. During program cycles of a write operation, the column line load can be optimized to provide relatively large changes in threshold voltage during initial program cycles and smaller changes in the threshold voltage when the threshold voltage nears a target level. The duration or pulse-width of programming pulses in the program cycles can similarly decrease with time so that the threshold voltage changes less when approaching the target threshold voltage. The large changes in threshold voltage during the initial programming cycles reduce the total programming time, and the small changes near the end of the write operation provide greater accuracy in the threshold voltage placement.

During verify cycles, the column line load provides a current such that when the selected memory cell is at the target threshold voltage, the row line programming voltage corresponds to the trip-point of a sense amplifier. For read operations, the row line coupled to the selected cell is at a constant high voltage, and the column line coupled to the selected cell has a load that changes until the trip-point of a sense amplifier is found. The read voltage for the row line can be the same as the programming voltage for the write operation so that the read and the verify operations have the same trip-points.

Figure 1:
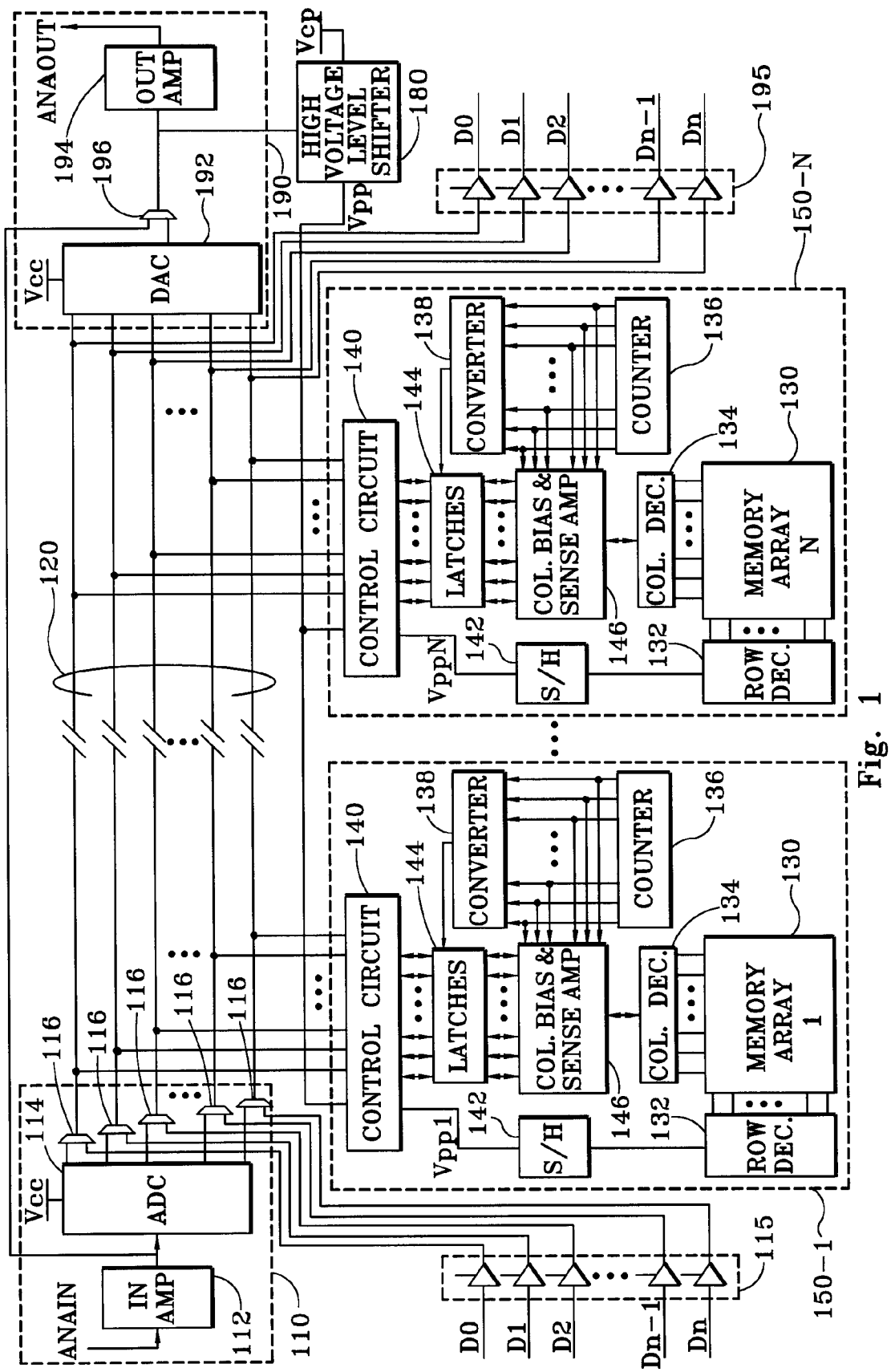
FIG. 1 is a block diagram of a multi-level memory in accordance with an embodiment of the invention.

FIG. 1 is a block diagram of a non-volatile multi-level memory 100 in accordance with an exemplary embodiment of the invention. Multi-level memory 100 includes an analog input interface 110, a digital input interface 115, an analog output interface 190, and a digital output interface 195. Alternative embodiments of multi-level memory can omit one or more of I/O interfaces 110, 115, 190, and 195. In particular, a purely digital multi-bit-per-cell memory does not require analog I/O interfaces 110 and 190, and a purely analog multi-level memory does not require digital I/O interfaces 115 and 195. However, digital I/O interfaces 115 and 195 are useful for testing even in purely analog memories because a low-cost digital tester can be used instead of the more costly analog testers. Digital I/O interfaces 115 and 195 can be standard I/O circuits including tri-state buffers that a control circuit (not shown) enables for digital input and output, respectively. Analog input interface 110 includes an input amplifier 112 and an analog-to-digital converter (ADC) 114. Input amplifier 112 amplifies an analog input signal ANAIN to fit in a desired range, and ADC 114 converts the amplified input signal to a multi-bit digital signal for use in memory 100. Multiplexers 116 select whether to provide the digital input signals from digital input interface 115 or the digital signal from ADC 114 to a global data bus 120 in memory 100.

For a read operation, digital output interface 195 outputs digital data signal from data bus 120, and analog output interface 190 outputs an analog signal ANAOUT corresponding to the digital value on global data bus 120. For this purpose, analog interface 190 includes a digital-to-analog converter (DAC) 192 and an output amplifier 194. DAC 192 converts the digital value on global bus 120 to an analog voltage, and output amplifier 194 amplifies the analog voltage according to a desired range for output analog signal ANAOUT. With this arrangement, both analog and equivalent multi-bit digital data are simultaneously available at all times.

For storage of data, multi-level memory 100 includes N banks 150-1 to 150-N. This specification uses the term bank 150 to generically refer to any one of banks 150-1 to 150-N. Each bank 150 includes a memory array 130, a row decoder 132, and a column decoder 134, which can be conventional in implementation. In an exemplary embodiment of the invention, each memory array 130 is an array for a Flash EEPROM and includes rows and columns of non-volatile memory cells that are floating gate transistors. The control gates of the floating gate transistors in each row of memory array 130 couple to a row line (or "word line") associated with the row. These row lines can be segmented, for example, using short row line segments in a polysilcon or other control gate layer and an overlying continuous row line coupled to the segments through select transistors. A column line (or "bit line") associated with a column of memory cells connects to the drains of the floating gate transistors in the column, and the sources of the floating gate transistors in an erasable sector (not shown) couple to a source line (not shown) associated with the sector.

Each row decoder 134 connects to an associated sample-and-hold (S/H) circuit 142 and the row lines of the associated memory array 130. S/H circuits 142 in banks 150-1 to 150-N respectively provide bias voltages Vpp1 to VppN as the bias voltages for selected row lines. Each row decoder 132 applies the row line bias voltage from the associated S/H circuit 142 to the selected row line for read or write operations. Row decoder 132 also biases (or typically grounds) the unselected row lines in the associated array 130. In accordance with an aspect of the invention, the row line voltage during a read or write operation is constant. However, the row line voltage for a write operation optionally depends on the value being written.

Column decoder 134 connects to the column lines in the associated array 130 and to a column bias and sense amplifier circuit 146. Column decoder 134 can be a conventional decoder that selects one or more column lines for access operations. In particular, column decoder 134 can select a single column line if each bank 150 accesses only one memory cell at a time. Alternatively, if each bank 150 simultaneously accesses multiple memory cells in the associated memory array 130, column decoder 134 can select as many column lines as there are memory cells being simultaneously accessed. Column bias and sense amplifier circuit 146 provides the biases that column decoder 134 applies to the selected column lines. In the exemplary embodiment, each bank 150 accesses only one memory cell at a time, column decoder 134 selects a single column line, and circuit 146 provides a single column line bias.

To achieve a high bandwidth for read and write operations, banks 150-1 to 150-N are capable performing pipelined access operations. In particular, a read or write operation can begin in one bank before a previously started read or write ends in another bank. U.S. Pat. No. 5,680,341, entitled "Pipelined Record and Playback for Analog Non-Volatile Memory"; U.S. Pat. No. 5,969,986, entitled "High-Bandwidth Read and Write Architecture for Non-Volatile Memories"; and U.S. patent application Ser. No. 09/434,588, entitled "High Bandwidth Multi-Level Flash Memory Using Dummy Memory Accesses to Improve Precision when Writing or Reading a Data Stream" describe suitable pipelined memory architectures and are hereby incorporated by reference in their entirety. In each bank 150, control circuit 140 controls the starting of accesses in the bank. For a series of accesses to consecutive addresses, control circuits 140 cyclically start access operations in banks 150-1 to 150-N, and the rate at which accesses start is such that bank 150-1 completes an access no later than just after bank 150-N starts an access. Accordingly, bank 150-1 is again ready to start an access just after bank 150-N starts an access, and a continuing data stream can be recorded to or played back from memory 100.

Before writing the first data values to a sector of array 130, the sector is erased. In the exemplary embodiment, erasing the sector lowers threshold voltages of the memory cells below the lowest level used to represent data. The sector may include reference cells, which are identical to the memory cells and are erased when the sector is erased. Alternatively, array 130 can include a sector of reference cells that is erased separately from the other sectors. In the exemplary embodiment, each bank 150 writes $2^n$ reference values in respective reference cells using the write process that is described below and accesses the reference cells to initialize a converter 138 used during read operations.

In memory 100, the input data values control the row line voltages Vppi (i ∈ {1, . . . , N}) for write operations. An input data value (analog or digital) is input through I/O interface 110 or 115. For a multi-bit digital data value, DAC 192 converts the digital data value to a corresponding analog voltage, and a 2-to-1 multiplexer 196 provides that analog voltage to a high voltage level shifter 180. For an analog data value, multiplexer 196 provides the analog voltage from input amplifier 112, to level shifter 180. The voltage level shifter 180 generates a bias signal Vpp at a voltage Vppi in a range suitable for the row line voltage during programming. For example, for a memory programmed by channel hot electron injection, the range of suitable voltage is typically between about 7 V and about 10 V. To shift the input analog voltage up to a voltage in that range, voltage shifter 180 requires a high supply voltage Vcp (about 12 V), which a charge pump circuit typically generates. Level shifter 180 provides bias voltage Vppi for the write operation in bank 150-i. Bias voltage Vppi is lower when a data value that bank 150-i is writing corresponds to a lower target threshold voltage and higher when the data value corresponds to a higher target threshold voltage. This results in smaller changes in the threshold voltage per program cycle for writing low threshold voltages and thereby improves accuracy for writing to low threshold voltages. The ideal result fully utilizes all of the available write time budget regardless of the level of the threshold voltage target.

Figure 2:
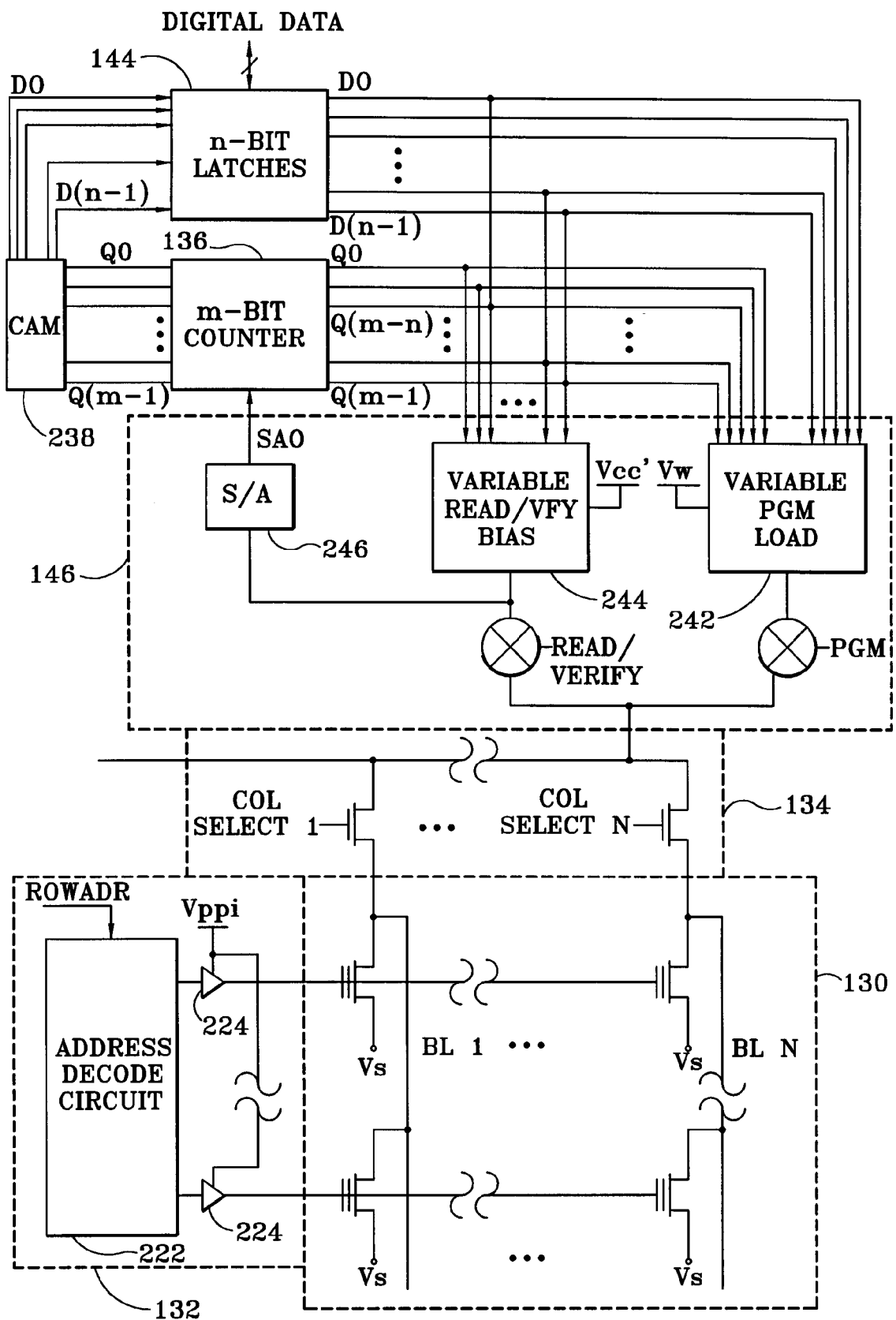
FIG. 2 shows read and write circuitry for a multi-level memory in accordance with an embodiment of the invention.

The control circuit 140 in the bank starting a write operation triggers the associated S/H circuit 142 to sample and hold the current voltage of bias signal Vppi. FIG. 2 shows a portion of a bank 150 for further description of the write operation. Row decoder 132 includes an address decode circuit 222 and drivers 224 that apply the sampled voltage Vppi from S/H circuit 142 to the selected row line. The voltage on the selected row line remains constant throughout the write operation. Voltage degradation of the sampled voltage Vppi from sample-and-hold circuit 142 is typically insignificant during the write time . (For the state-of-the-art Flash memory cells and advanced analog/multi-level or multi-bit-per-cell memories, the write time per memory cell is typically less than about 10 $\mu$s.) However, sample-and-hold circuit 142 still requires stringent circuit design and layout guidelines to reduce the potential leakage currents such as sub-threshold conduction, junction leakage, minority carrier injection, or forward biasing of junctions from neighboring regions.

At the start of a write operation, control circuit 140 triggers latches 144 to latch an n-bit data value from global bus 120. Control circuit 140 can also set an m-bit counter 136 where m is greater than or equal to n. The n-bit signal on global bus 120, at that time, is either the input digital signal from digital input interface 115 or the digital signal output from ADC 114 depending on whether analog input signal ANAIN or digital input signal D[0:n] represents the data value being written.

Column bias circuit 146 selects a load for the selected column line. In the embodiment of FIG. 2, column bias circuit 146 includes a variable program load 242, a variable read/verify load 244, and a sense amplifier 246. Column decoder 134 connects variable load 242 to the selected column line during a series of program cycles and connects variable load 244 and sense amplifier 246 to the selected column line during a series of verify cycles. During the program cycles, variable load 242 provides the column line load according to the value from latch 144 or the count in counter 136. For channel hot electron injection programming, the column line write voltage Vw applied through variable load 242 is about 6 volts. Variable load 242 provides the column line load for the program cycles of the write operation. The column line load depends on the data value being written or the count in counter 136. With dependence on the data value, the column line load provides smaller programming current for smaller threshold voltage changes per program cycle, when the target threshold voltage is low. With dependence on the count, the column line load increases during programming to provide smaller programming current for smaller threshold voltage changes per program cycle when the write operation nears the final target threshold voltage. Both dependencies for the column line load improve the accuracy of the write operation. However, an alternative embodiment of the invention uses a fixed column line bias that is the same regardless of the data value, and techniques such as controlling of program cycle duration or row line voltage provide the necessary accuracy.

Figure 3:
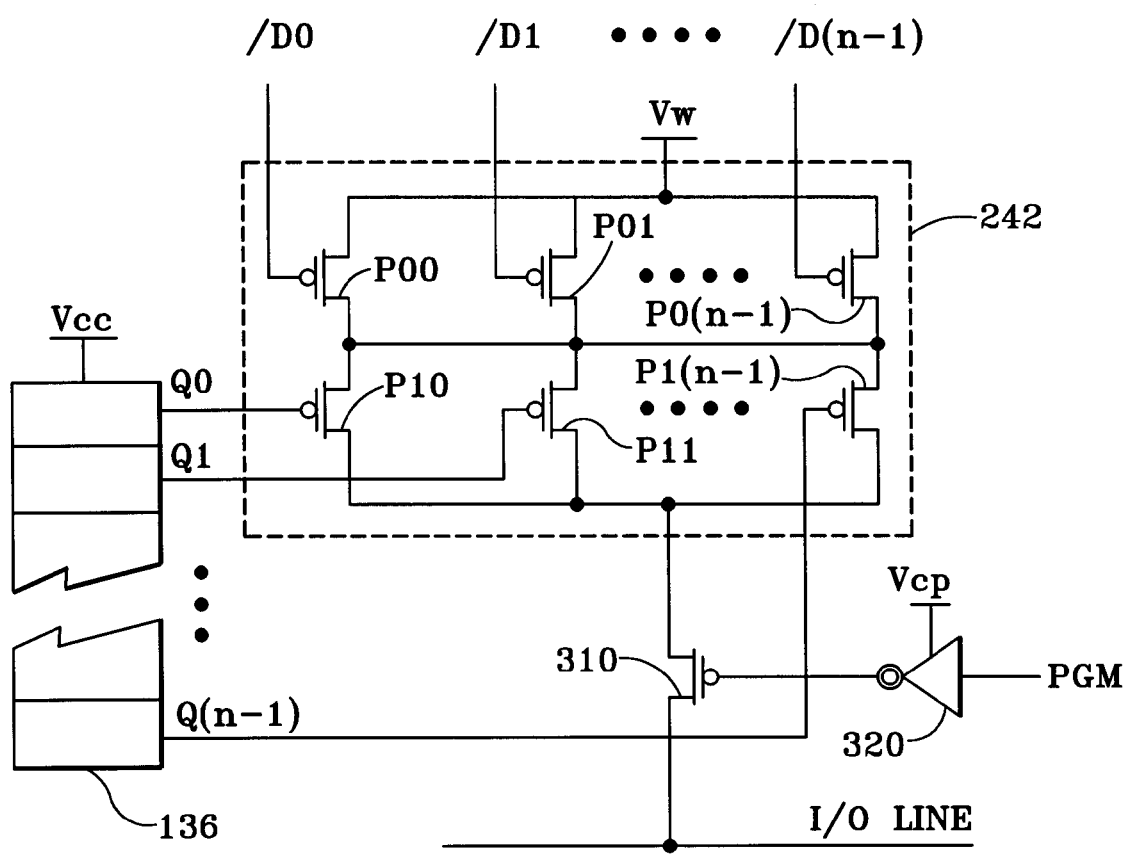
FIG. 3 shows a variable column line bias circuit for write operations in accordance with an embodiment of the invention.

In the exemplary embodiment, a combination of a data signal D[0:(n−1)] from latches 144 and the count Q[0:(m−1)] from counter 136 selects the load. FIG. 3 illustrates an exemplary embodiment of variable load 242. In this embodiment, variable load 242 includes two sets of P-channel transistors P01 to P0(n−1) and P11 to P1(n−1). Transistors in each set have current capacities that sequentially double. For example, the current capacity of transistor P01 is twice the current capacity of P00, and the current capacity of transistor P0(n−1) is $2^{(n-1)}$ times the current capacity of P00. Similarly, the current capacity of transistor P11 is twice the current capacity of P10, and the current capacity of transistor P1(n−1) is $2^{(n-1)}$ times the current capacity of P10. Transistors P00 to P0(n−1) are connected in parallel and have gates respectively coupled to data bits /D0 to /D(n−1), which are the logical complements of data bits D0 to D(n−1). Transistors P10 to P1(n−1) are connected in parallel with each other and in series with transistors P00 to P0(n−1). Count bits Q0 to Q(n−1) are on the gates of transistors P10 to P1(n−1), respectively.

During the write operation, complementary bits /D0 to /D(n−1) turn on select transistors P00 to P0(n−1), making the total current capacity of transistors P00 to P0(n−1) proportional (and the resistance inversely proportional) to the data value. Counter 136 starts with count Q[0:(m−1)] at zero which turns on all of transistors P10 to P1(n−1) for the first program cycle. Counter 136 then periodically increments count Q[0:(m−1)]. As a result, the total resistance (or total current capacity) of transistors P10 to P1(n−1) starts at a minimum resistance (or maximum current capacity), and the total resistance (or current capacity) increases (or decreases) to reduce the programming current during program cycles that are late in the write operation. As mentioned above, the column-line write voltage Vw is typically about 6 volts when supply voltage Vcc is typically about 3 volts. Complementary data bits /D0 to /D0(n−1) and count bits Q0 to Q(n−1) can have a logic low level corresponding to ground and a logic high level corresponding to supply voltage Vcc or charge pump voltage Vcp, which is greater than or equal to write voltage Vw. When supply voltage Vcc is the logic high level, transistors P00 to P0(n−1) and P10 to P1(n−1) still conduct when gate voltages are at the logic high level. However, even when none of the transistors are completely off, the programming current still depends on the data value and decreases during the write operation. A high-voltage inverter 320 shuts off a transistor 310, which is in series with variable load 242, to completely turn off the current through variable load 242 for a read operation or a verify cycle.

Figure 4:
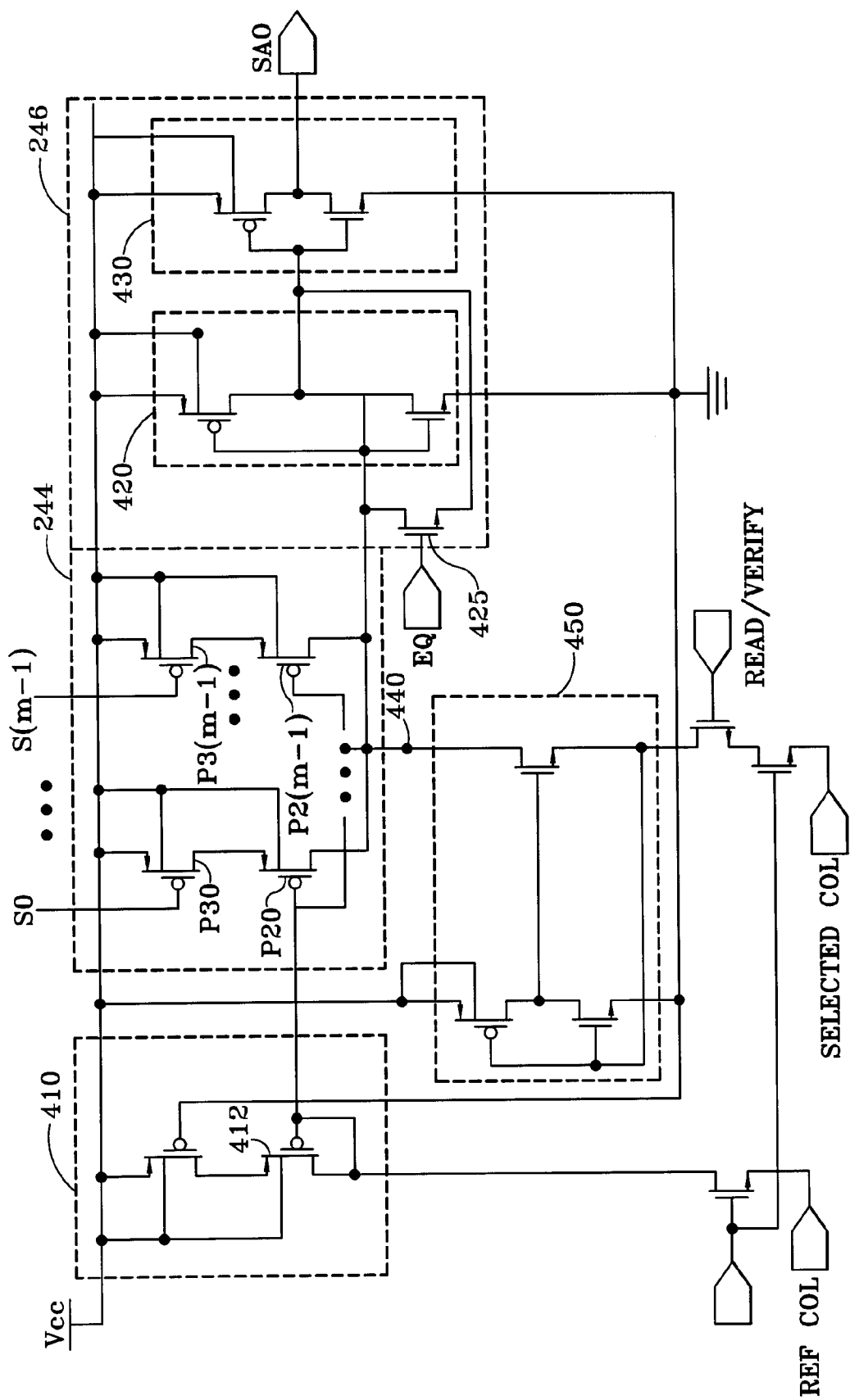
FIG. 4 is a circuit diagram of a variable column line bias circuit and a sense amplifier in accordance with an embodiment of the invention.

During verify cycles, variable load 244 (FIG. 2) in variable load circuit 146 receives data signal D[0:(n−1)] as a control signal, and in response, variable load 244 selects a column line bias current that depends on the data value. FIG. 4 shows portions of a bank 150 including circuitry for biasing the selected column line for a read operation or a verify cycle. In FIG. 4, variable load 244 includes m current paths from supply voltage Vcc, typically about 3 volts. Each current path includes a pair of series connected P-channel transistors, including a switch transistor from a set of transistors P30 to P3(m−1) and a current mirror transistor from a set of transistors P20 to P2(m−1), respectively. In the exemplary embodiment, each of transistors P21 to P2(m−1) has twice the effective channel width of the preceding transistor P20 to P2(m−2), respectively. Each of transistors P30 to P3(m−1) is at least as large as the respective series-connected transistor P20 to P2(m−1).

The gates of switch transistors P30 to P3(m−1) respectively receive control signals S0 to S(m−1). During the verify operation, the n most significant control bits S(m−n) to S(m−1) of the select signal are data bits /D0 to /D(n), respectively. The least significant bits may receive a fixed signal that turns on one or more switch transistor S0 to S(m−n−1) so that variable load 244 has at least one active current path conducting current from supply voltage Vcc, even when the data bits D0 to D(n) represent the value zero. Transistors P20 to P2(m−1) have gates coupled to a P-channel transistor 413 in a current mirror circuit 410. Current mirror 410 has a reference current path through a reference column line of associated array 130. The reference cells in the reference column are erased with a sector of storage cells and can be left in the erased state or programmed using a timed programming that does or does not employ verify cycles. The row line voltage applied to the selected memory cell is also applied to a reference cell in the reference column. Transistor 412 in the reference current path has its gate and drain coupled to the gates of transistors P20 to P2(m−1). Complementary data signals /D0 to /Dn select which of the m current paths can supply the bias current to the selected column line for a sensing operation during a verify cycle.

The bias current and voltage Vcc for the selected column line during the verify cycles are significantly lower than the programming current and voltage Vw for the selected column line during the program cycles. Accordingly, the verify cycles do not significantly change the threshold voltage of the selected memory cell. More particular, the read or verify disturb can be kept to a minimum by restricting the bit line voltage to less than about 1.5 volts during a read or verify operation. However, to reduce the disturbance of the threshold voltages of unselected memory cells due to repeated access of other cells on the same word line (i.e., gate disturb), the row lines in arrays 130 can be segmented (e.g., as in a divided WL array architecture) to limit the number of memory cells exposed to the high row line voltages during write and read operations.

Sense amplifier 246 includes a pair of inverters 420 and 430 connected in series, an equalizing transistor 425, and an amplifying circuit 450. For sensing, transistor 425 equalizes the voltages on the input and output terminals of inverter 420 in response to an equalization signal EQ. This puts inverter 420 in an unstable state (high gain region) and charges a node 440 to an intermediate voltage between supply voltage Vcc and ground. Asserting signal READ/VERIFY charges the selected column line. When signal EQ is negated, the states of inverter 420 and inverter 430 change decisively according to the voltage on node 440, and in particular according to the voltage change that load 244 and the selected memory cell cause from the intermediate voltage level. Node 440 connects to the selected column line via feedback "cascode" circuit 450, which acts to amplify voltage swings on node 440 according to voltage swings on the selected column line.

When variable load 244 initially provides a current greater than the current that the selected column line draws, the voltages on the selected column line and node 440 rise. As a result, inverter 430 asserts signal SAO high. When the selected column line initially draws more current than the variable load 244 provides, the voltages on the selected column line and node 440 drop. As a result, inverter 430 negates signal SAO. At the trip-point of sense amplifier 246, the selected column line draws a small current that is about equal to the bias current from current mirror 410, and node 440 remains at the intermediate voltage during the period allowed for sensing. Accordingly, the trip-point of sense amplifier 246 changes according to which of switch transistors P30 to P3(m−1) conduct and thus varies with the data value (or more particularly with data signals D[0:(n−1)]).

The current through variable load 244 controls the target threshold voltage for a write operation. In particular, for data signal D[0:(n−1)], the target threshold voltage is the threshold voltage at which the selected memory transistor having a control gate at voltage Vppi conducts the current that variable load 244 provides. In memory 100 of FIG. 1, the row line voltage Vppi for a write operation in a bank 150 depends on data signal D[0:(n−1)] representing the value being written.

For a read operation, level shifter 180 (FIG. 1) provides signal Vpp at a voltage level greater than any threshold voltage that represents a stored value, for example, at the minimum row line voltage for write operations. At the start of the read operation in a bank 150, control circuit 140 triggers the associated S/H circuit 142 to hold the value of signal Vpp for the read operation. When the selected row line is charged and S/H circuit 142 holds the row line voltage, control circuit 144 starts counter 136.

Counter 136 provides an m-bit digital count Q[0:(m−1)] (or a complementary count /Q[0:(m−1)]) that variable load 244 uses in selecting the column line load for the selected column line. For the embodiment of FIG. 4, counter 136 provides m-bit complementary count /Q[0:(m−1)] as the select signal S[0:(m−1)]. This differs from the verify cycle of a write operation where complementary data signal /D[0:(n−1)] provides only the n most significant bits S[(m−n):(m−1)] of the select signal.

In one embodiment, counter 136 sequentially counts up or down from a starting point, and in response column bias circuit 146 sequentially increases or decreases the column line bias current. The count in counter 136 when column bias circuit 146 provides the maximum current for which the sense amplifier trips (or the minimum current for which the sense amplifier fails to trip) indicates the data value read from the memory cell. In the exemplary embodiment, the row line voltage for the selected row line during a read is equal to or lower than the lowest programming voltage. With a lower row line voltage, the selected memory cell conducts less current than in the verify operations of the write process. Accordingly, the n most significant bits of the count Q[(m−n):(m−1)] generally differ from the data signal D[0:(n−1)] used during the write operation. (When the row line voltage for a read operation is equal to the lowest row line voltage for a write operation, the trip-point for the read operation is the same as the trip-point used in verify operations if the memory cell has a threshold voltage corresponding to the lowest threshold voltage that represents a data value. Accordingly, for a read using the lowest programming voltage, the n most significant bits of the count Q[(m−n):(m−1)] should equal the data signal D[0:(n−1)] when the memory cell being read stores the data value having the lowest threshold voltage.)

Converter 138 converts that m-bit count Q[0:(m−1)] into an n-bit data signal D[0:(n−1)] representing the digital value read. In particular, as shown in FIG. 2, converter 138 can include a content addressable memory (CAM) 238 or other memory device containing count values determined from a set of reference read operations. More specifically, $2^n$ different values for n-bit data signal are written in $2^n$ reference cells in array 130, and m-bit reference counts from counter 136 that result from a series of reference read operations are stored in CAM 238 in entries having addresses corresponding to the $2^n$ data values. During a read operation, CAM 238 compares an m-bit read count from counter 130 to the m-bit reference counts and outputs a digital value D[0:(n−1)] equal to the n-bit CAM address containing the reference count closest to the read count. Latches 144 latch the data value from CAM 238, and control circuit 140 (FIG. 1) controls when to output the digital value from the bank 150 to global bus 120. The digital value can be output through digital output interface 195 or converted to analog output signal ANAOUT in analog output interface 190.

Another embodiment of the invention provides a read operation with a fast average access time using a binary search instead of the sequential counting described above. For the binary search, counter 136 is an up-down counter with a variable step. Control circuit 140 operates counter 136 to perform the binary search. In an exemplary binary search, counter 136 starts with a count in a middle of the range of counts (e.g., at $2^m/2$), and with a step size equal to one quarter of the range of the count (e.g., a step equal to $2^m/4$). The exemplary binary search requires m sensing operations where m is the number of bits in the count. Variable load 244 provides a column line current according to the latest count for each sensing. For (m−1) sensings, if the sense amplifier trips (or does not trip), control circuit 140 directs counter 136 to count up (or down) by the current step size and then cuts the step size in half. For the last sensing, control circuit 130 directs counter 136 to count down by one if the sense amplifier trips. If the sense amplifier does not trip on the last sensing, counter 136 does not count. Converter 138 converts the count after the last sensing to the data value as described above.

The binary search requires m sensing operations, significantly fewer than the average number required with sequential counting when m is three or more. In particular, sequentially incrementing (or decrementing) the count in counter 138 on average requires about $2^m/2$ sensing operations before the finding the count corresponding to the trip-point. In the worst case, sequentially incrementing (or decrementing) the count requires $2^m$ sensing operations before the finding the count corresponding to the trip-point.

Figure 5:
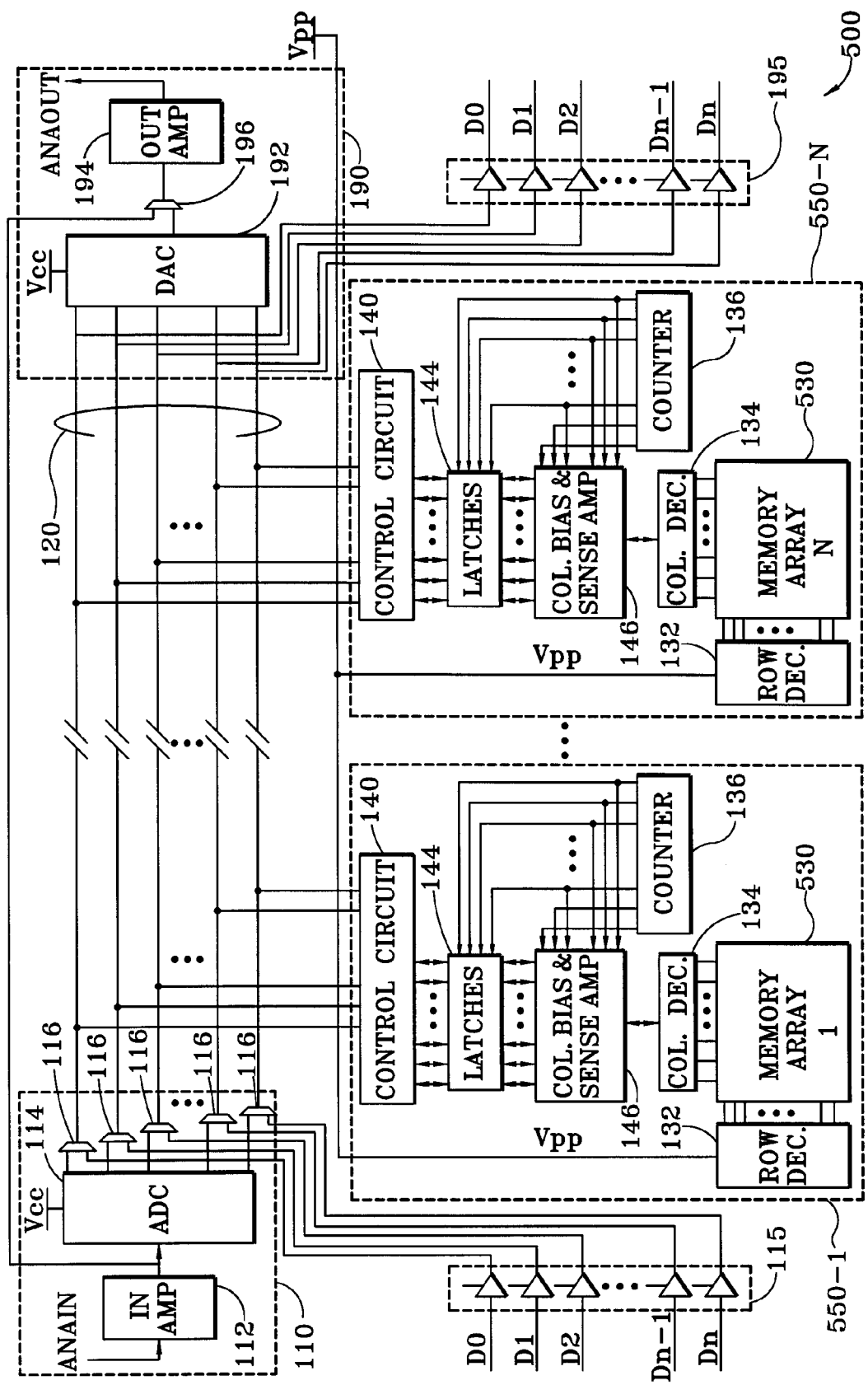
FIG. 5 is a block diagram of a multi-level memory in accordance with another embodiment of the invention.

FIG. 5 shows a memory 500 in accordance with an alternative embodiment of the invention. Memory 500 differs from memory 100 of FIG. 1 in that memory 500 uses a fixed row line voltage Vpp (typically about 9–10 V) for write operations regardless of the data value being written and uses the same row line voltage Vpp for read operation. Accordingly, selected memory cells draw the same current during verify cycles of the write operation and during sensing during a read operation. As a result, the most significant bits of the count corresponding to the sense amplifier trip-point found during a read operation are equal to the data bits used during the read operation. Thus, converter 138 can be eliminated. Further, memory arrays 530 in banks 550 do not require reference cells for initialization of the converter. Also, a charge pump circuit and a voltage regulation circuit (not shown) provides the fixed voltage Vpp directly to row decoder 132 so that memory 500 does not require S/H circuits 142. Thus, memory 500 is less complex and generally requires less integrated circuit area for fabrication in a semiconductor device. However, since the word line voltage is high during a read, the memory could be subject to a gate disturb effect. The gate disturb effect can be minimized by minimizing the high voltage Vpp, using a divided word line array architecture as described above, or tracking the gate disturb with reference cells and a converter (e.g., CAM 238) to provide a correct data value even after the gate disturb changes threshold voltages.

Use of a fixed row line voltage Vpp for all write operations regardless of the data value being written facilitates implementation of parallel write operations that simultaneously access two or more memory cells on the same row line. For example, if each memory cell stores four bits of information, two memory cells can be simultaneously read to provide an 8-bit data value.

As noted above, adjusting the row line voltage according to the data value written is one technique for improving the accuracy of write operations. For better accuracy in memory 500 where the row line voltage is fixed, memory 500 can vary the column line load and/or the duration of program cycles according to data value and the expected difference between the threshold voltage of the selected memory cell and the target threshold voltage. FIG. 3 as described above illustrates a circuit and method for adjusting the column line load to improve the accuracy of a write operation.

Figure 6A:
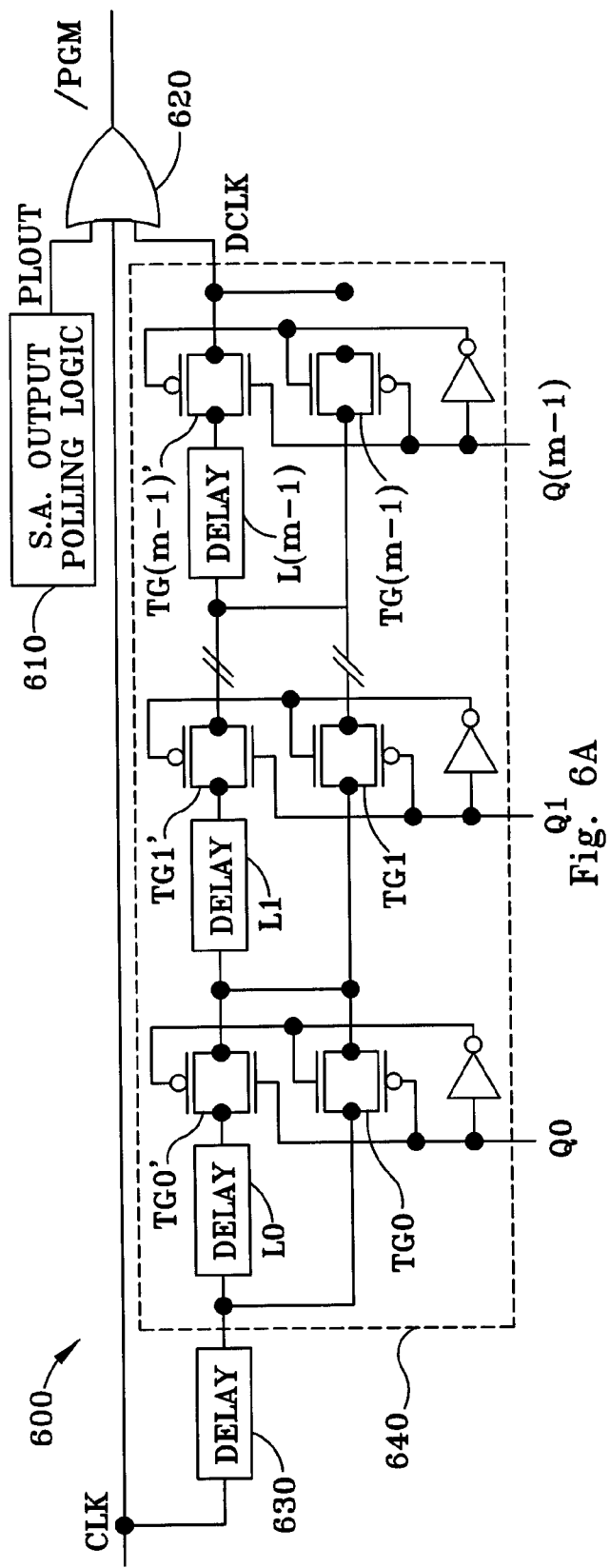
FIGS. 6A and 6B illustrate protions of a circuit for controling programming pulses having durations that in accordance with an embodiment of the invention, depend on a count.

FIG. 6A illustrates a control circuit 600 that generates a signal /PGM for controlling the timing and duration of program cycles during a write operation. In accordance with an aspect of the invention, the program cycles shorten as the count Q[0:(m−1)] increases and stop when the selected memory cell reaches the target threshold voltage. Control circuit 600 includes sense amplifier polling logic 610, an OR gate 620, a delay 630, and a programmable delay 640. Polling logic 610 asserts signal PLOUT (high) to stop further programming cycles when the threshold voltage of the selected memory cell corresponds to the sense amplifier's trip-point. An input signal CLK to control circuit 600 is asserted (high) during the verify cycles. Delay 630 and programmable delay 640, which are connected in series between a terminal for input of signal CLK and an input terminal of OR gate 620, generate a delayed signal DCLK from signal CLK. Two other input terminals of OR gate 620 receive signals CLK and PLOUT. OR gate 620 asserts signal /PGM (low) for a program cycle when none of signals CLK, DCLK, and PLOUT are asserted (high).

Figure 6B:
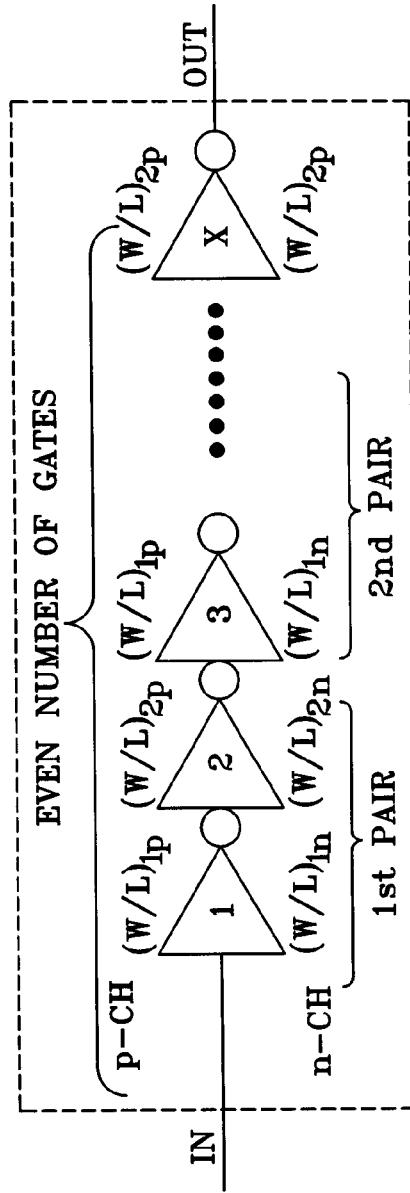

In an exemplary embodiment of the invention, programmable delay 640 includes delays L0 to L(m−1) and transfer gates TG0 to TG(m−1) and TG0' and TG(m−1)'. Delays L0 to L(m−1) have respective delay times Δt0 to Δt(m−1), where each delay time Δt1 to Δt(m−1) is twice the preceding delay time Δt0 to Δt(m−2). FIG. 6B shows an exemplary embodiment of a delay that includes an even number of inverters. Each inverter includes a p-channel pull-up transistor and an n-channel pull-down transistor. An effective way to maximize the delay time for any given number of gates is to use inverter pairs with alternating trip points. For example, the p-channel transistors in the odd numbered inverters have a channel width-to-length ratio that is much greater than the channel width-to-length ratio of the n-channel transistors in the odd numbered inverters, and the p-channel transistors in the even numbered inverters have a channel width-to-length ratio that is much less than the channel width-to-length ratio of the n-channel transistors in the even numbered inverters.

Referring again to FIG. 6A, delays L0 to L(m−1) are in series with respective transfer gates TG0' to TG(m−1)' between a respective pair of delays, and transfer gates TG0 to TG(m−1) are connected in parallel with respective delays L0 to L(m−1). Programmable delay 640 provides a delay that is proportional to the value of count Q[0:(m−1)]. Specifically, each of bits Q0 to Q(m−1) having value zero turns on the respective one of pass gates TG0 to TG(m−1) thereby bypassing the associated one of delay L0 to L(m−1). Each of bits Q0 to Q(m−1) having value one shuts off the respective one of pass gates TG0 to TG(m−1) and turns on the respective one of pass gates TG0' to TG(m−1)' thereby directing the signal through the associated one of delays L0 to L(m−1).

Figure 7:
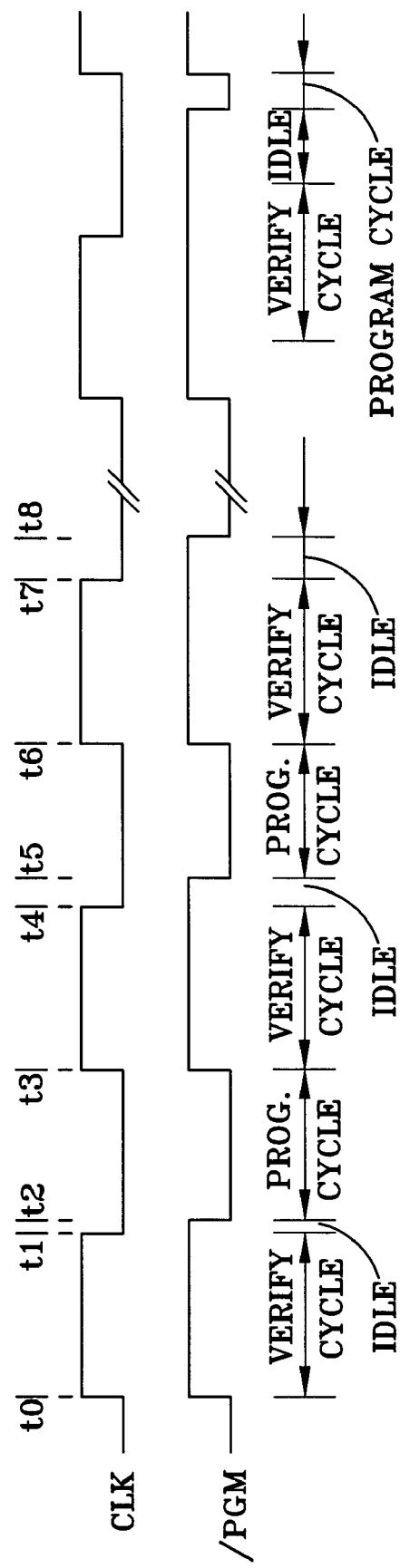
FIG. 7 is a timing diagram showing the timing of program and verify cycles under control of the circuit of FIG. 6A.

FIG. 7 shows a timing diagram for signals CLK and /PGM from control circuit 600 during a write operation. Initially, count Q[0:(m−1)] is zero, and signal PLOUT is not asserted. The following description assumes that polling logic 610 does not detect the write process reaching the trip-point during the times discussed so that signal PLOUT remains low. Between times t0 and t1, signal CLK is asserted (high) for a verify cycle, and OR gate 620 keeps signal /PGM high in response. At time t1, signal CLK transitions to low, but signal /PGM remains high because delayed signal DCLK remains high. At time t2, when signal DCLK transitions to low, signal /PGM transitions to low, and a first programming pulse starts. Signal /PGM transitions back to high at time t3 to stop the first programming pulse for the next verify cycle. The first program pulse has a duration or pulse width that is less than the time between verify cycles by an idle time corresponding to the total delay that delays 630 and 640 provide.

At time t2, the counter increments count Q[0:(m−1)]. The next high-to-low transition in delayed signal DCLK is at a time t5, which follows the transition at time t4 in signal CLK by the delay that the new count selects. Accordingly, an idle time between times t4 and t5 is longer than the idle time between times ti and t2, and a second programming pulse, which is between times t5 and t6, is shorter than the first programming pulse. Each time the count increments the idle time between consecutive verify cycles increases and the duration of the programming pulse decreases. The verify cycles have a fixed duration to allow for consistent sensing operations that are the same during each verify cycle.

Figure 8:
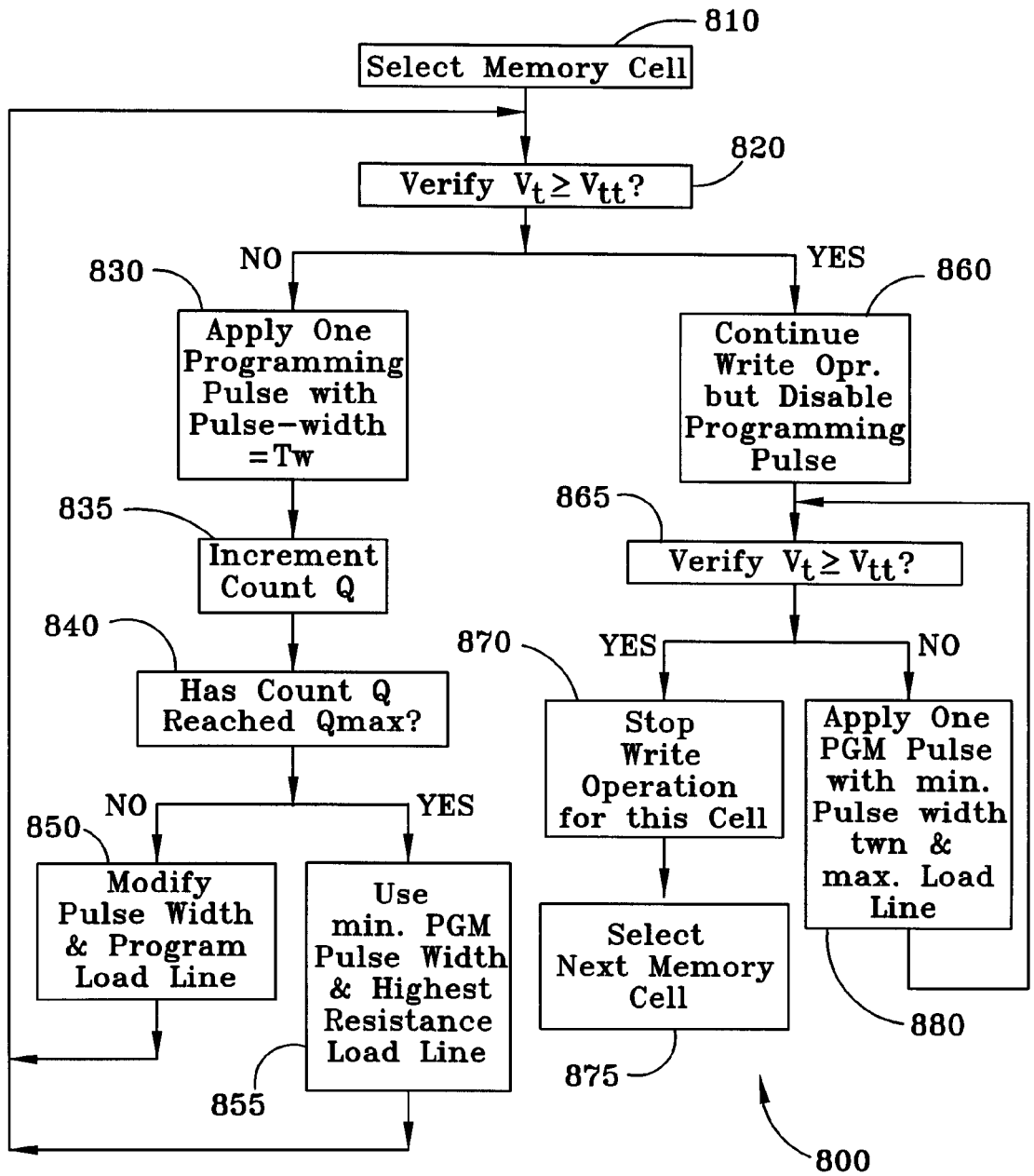
FIG. 8 is a flow diagram of a write process in accordance with an embodiment of the invention.

FIG. 8 is a flow diagram of a write operation 800 in accordance with another embodiment of the invention. In an initial step 810, write operation 800 selects a memory cell by applying row line voltage Vpp to a selected row line and connecting a selected column line to the column line bias circuit. The selected memory cell is the memory cell that has a control gate coupled to the selected row line and a drain coupled to the selected column line. The source of the selected memory cell is grounded. The row line voltage Vpp on the control gate of the selected memory cell remains constant throughout write operation, but the column line bias varies as described below. Initially the memory cell is in an erased state and should have a threshold voltage Vt lower than any of the threshold voltages representing data.

Once the memory cell is selected, a verify cycle 820 determines whether the threshold voltage Vt of the selected memory is greater than a target threshold voltage Vtt for the memory cell. In particular, verify cycle 820 determines whether the sense amplifier trips when the selected column line is biased according to the data value being written. If the sense amplifier fails to trip, the threshold voltage Vt is greater than the target threshold voltage Vtt.

If the threshold voltage Vt is not greater than the target threshold voltage Vtt, a program cycle 830 applies a programming pulse to increase the threshold voltage of the selected memory cell. Programming pulse 830 includes the application of the write voltage Vw through the variable load to the selected column line while the selected row line is at the program voltage Vpp, which can be a fixed predetermined voltage or dependent on the target threshold voltage. The programming pulse has a pulse-width (or duration) Tw that can depend on the data value being written and the number of previous program cycles. The column line load selected for the pulse can also depend on the data value being written and the number of previous program cycles.

After the program cycle 830, step 835 increments a count Q, and step 840 compares count Q to a maximum or cut-off count Qmax. If count Q is less than the maximum count Qmax, step 850 sets the pulse-width Tw and the column line load for the next program cycle, according to the new value of count Q. If the count Q is greater than or equal to count Qmax, step 855 sets the pulse-width Tw to a minimum and directs the column line load to provide the minimum programming current for the next program cycle. These minimums typically depend on the data value, but alternatively can be the same for all data values.

After either step 850 or 855, write process 800 returns to step 820 and conducts a verify cycle to determine whether the threshold voltage Vt of the selected memory cell has reached the target threshold voltage Vtt. Typically, the write operation requires multiple program cycles 830 to raise the threshold voltage Vt to the target threshold voltage Vtt. The initial program cycles use relatively long programming pulses and relatively large programming currents (or lower resistive program loads) to increase programming speed. As the count increases, the threshold voltage Vt should near the target threshold voltage Vtt, and the program cycles have shorter pulse-widths and lower programming current (or higher resistive program loads). As a result, the threshold voltage changes in finer steps for program cycles near the target threshold Vtt. After the count Q reaches the maximum count Qmax, the programming pulse has the minimum pulse-width and minimum current for the smallest threshold voltage change per program cycle. Accordingly, the threshold voltage Vt does not exceed the target threshold voltage Vtt by much when verify cycle 820 senses the selected memory cell reaching the trip-point of the sense amplifier.

To further improve accuracy, write operation 800 continues after sensing the trip-point with an idle step 860. Idle step 860 corresponds to an interval associated with a program cycle, but the programming pulse is disabled during idle step 860. The threshold voltage Vt of the selected memory cell remains unchanged during idle step 860. Alternatively, idle step could include a programming pulse having minimum duration and programming current. Following idle step 860, a verify cycle 865 again senses whether the threshold voltage Vt of the selected memory cell corresponds to the target threshold voltage. If verify cycle 865 confirms that the threshold voltage Vt is at or above the target threshold voltage Vtt, write operation 800 stops further programming of the selected memory cell (step 870) and selects another memory cell for the writing of the next data value (step 875).

If verify cycle 865 fails to verify that the threshold voltage Vt of the selected memory is at or above the target threshold voltage Vtt, write operation 800 performs another program cycle 880 using the minimum pulse width and minimum programming current. After program cycle 880, write 800 branches back to verify cycle 865 and again attempts to verify that the threshold voltage Vt is at or above the target threshold voltage. The write process 800 can repeatedly loop through program cycle 880 and verify cycle 865 if necessary to confirm that the selected memory cell has the target threshold voltage Vtt. Accordingly, if verify cycle 820 incorrectly indicates that the selected memory cell has reached the target threshold voltage, program and verify cycles 880 can program the threshold voltage Vt up to the target threshold voltage Vtt.

Figure 9A:
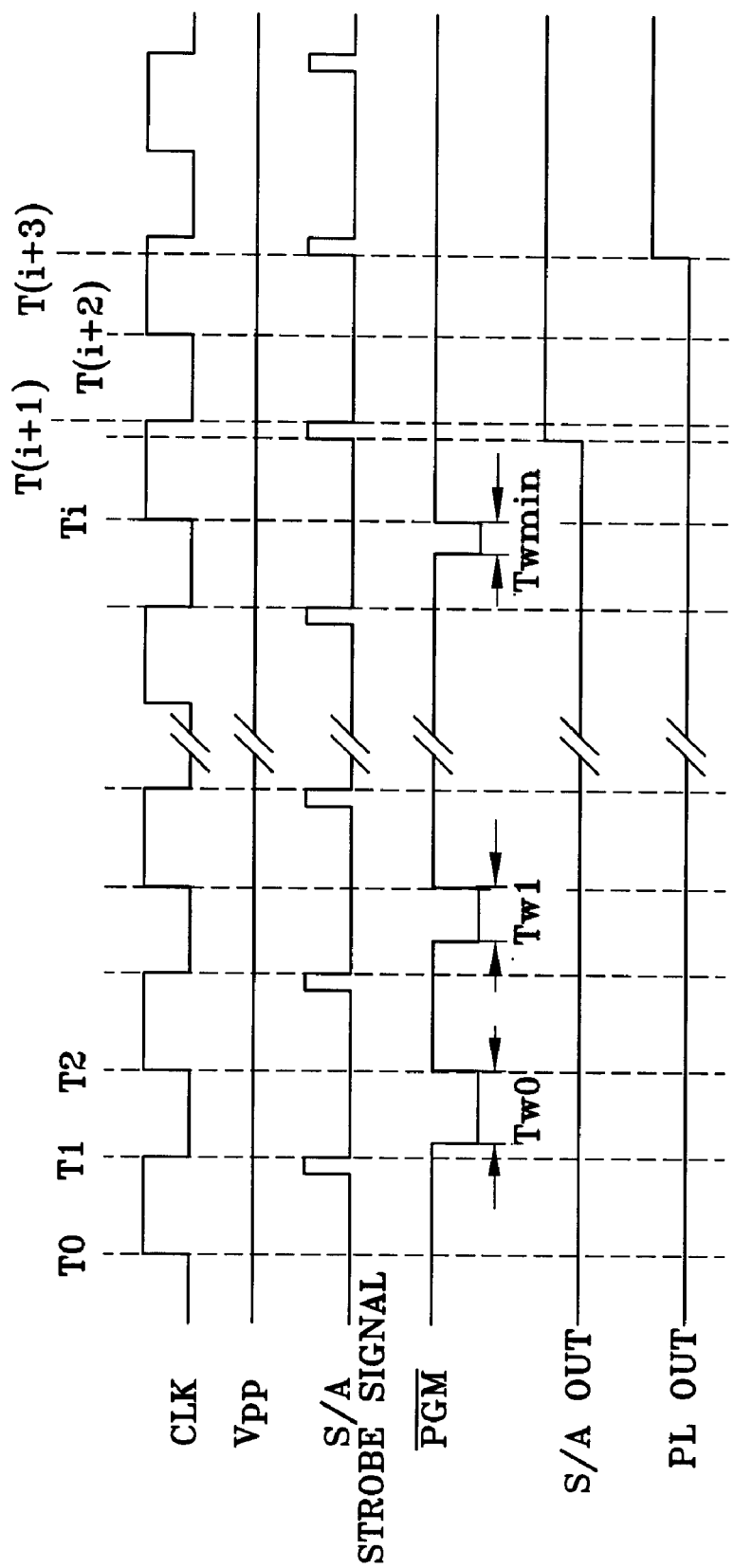
FIGS. 9A and 9B are timing diagrams illustrating signals generated for two scenarios for the write process of FIG. 8.
Figure 9B:
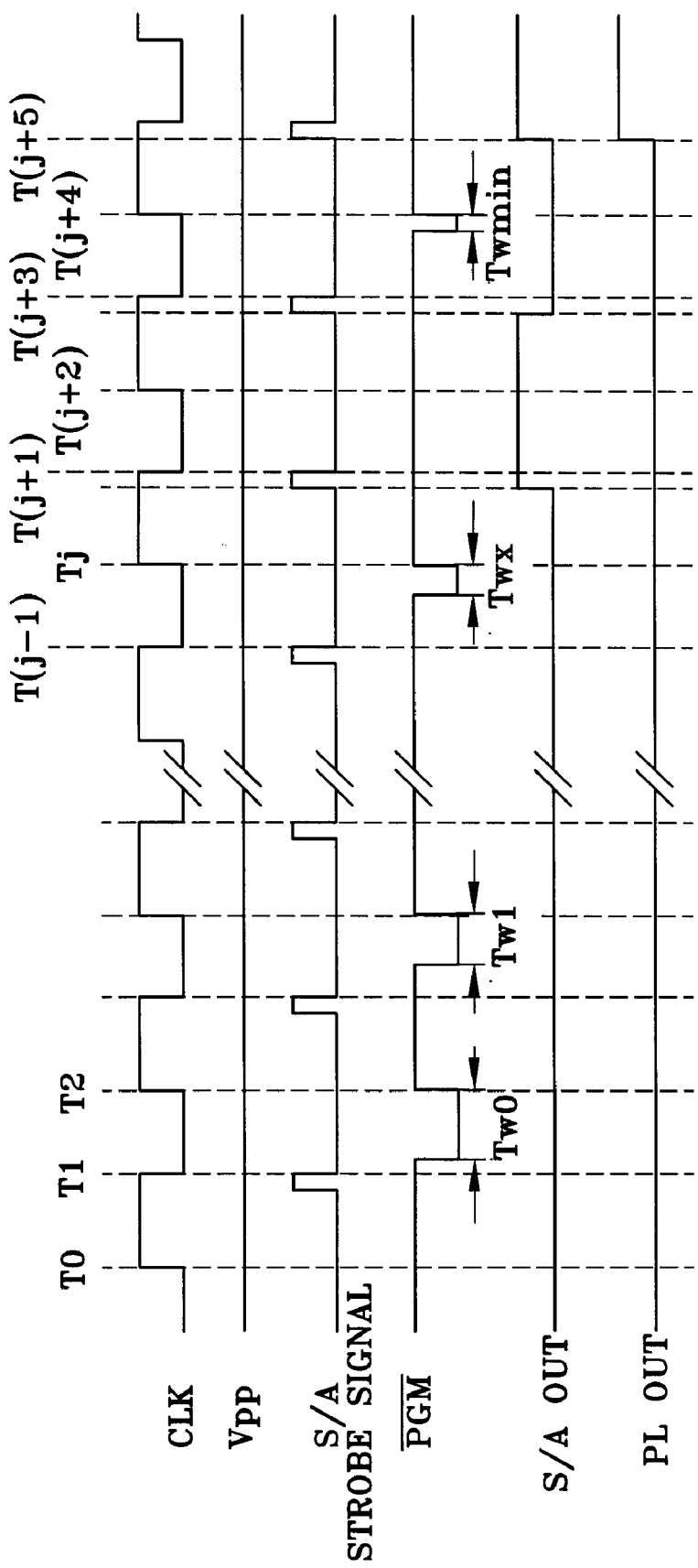

FIGS. 9A and 9B illustrate the timing of signals generated for two scenarios of write operation 800 of FIG. 8. In FIGS. 9A and 9B, the row line voltage Vpp for the selected memory cell is constant at a level that can either depend on the target threshold voltage Vtt or be independent of the target threshold Vtt. The drain bias of the selected column line takes levels for a programming pulse when programming control signal /PGM is low during the programming pulses. Clock signal CLK is low during program cycles and high during verify cycles. The duty cycle and frequency of clock signal is selected according to the desired maximum programming pulse-width Tw0 (typically about 100 ns) and the required sensing time (also typically about 100 ns) of the sense amplifier. A sense amplifier strobe signal is pulsed at the end of each verify cycle, and in response, the sense amplifier output signal SAOUT goes to a voltage level that depends on whether the sense amplifier is tripped or not during the verify cycle. In particular, when the strobe signal is asserted, signal SAOUT is asserted high only if the sense amplifier did not trip during the current verify cycle. Polling logic asserts an output signal PLOUT only after a second verify cycle during which the sense amplifier fails to trip.

Referring to FIG. 9A, a write operation begins at a time T0 with a first verify cycle that ends at time T1. During the first verify cycle, the sense amplifier trips indicating that the threshold voltage Vt of the selected memory cell is below the target threshold voltage Vtt. During a first programming cycle, which is between times T1 and T2, a programming pulse has the maximum pulse width Tw0. For each subsequent verify cycle during which the sense amplifier trips, the following program cycle includes a programming pulse. These programming pulses progressively shorten, and each program cycle increases the threshold voltage of the selected cell by a smaller amount. The programming pulses may reach the minimum pulse width Twmin or not before the sense amplifier fails to trip during a verify cycle. In FIG. 9A, the pulse width decreases to the minimum width Twmin before a time Tx, which is the beginning of the verify cycle during which the sense amplifier first fails to trip. By the end of that verify cycle, signal SAOUT is asserted high which prevents a programming pulse during the program cycle between times T(i+1) and T(i+2). During the following verify cycle, which is between times T(i+2) and T(i+3), the sense amplifier again fails to trip, and the polling logic asserts signal PLOUT to indicate the end of the write operation. This effectively terminates the write cycle for the selected memory cell.

The write operation of FIG. 9B begins in the same manner with a first verify cycle between times T0 and T1, and a first program cycle between times T1 and T2. During subsequent program cycles, the threshold voltage increases, and the pulse widths of the programming pulses decrease until the sense amplifier fails to trip during a verify cycle between times Tj and T(j+1). By the end of that verify cycle, signal SAOUT is asserted high which prevents a programming pulse during the program cycle between times T(j+1) and T(j+2). In response to signal SAOUT being asserted, the control logic sets the pulse-width and the programming current to minimum values to be used if the write operation includes any further programming pulses. During the following verify cycle, which is between times T(j+2) and T(j+3), the sense amplifier trips, indicating that the first failure to trip may have resulted from transitory effects such as noise or "hysteresis." By time T(j+3), signal SAOUT is negated (low) which prevents polling logic from asserting signal PLOUT and enables a programming pulse for the following program cycle. During the program cycle between times T(j+3) and T(j+4), a programming pulse, which has the minimum pulse width and the minimum programming current, increases the threshold voltage of the selected cell by a minimum amount. The polling logic asserts signal PLOUT in response to the second assertion of signal SAOUT at time T(j+5). Alternatively, the polling logic can be designed to wait for three or more failures of the sense amplifier to trip or for two or more consecutive failures of the sense amplifier to trip.

Although the invention has been described with reference to particular embodiments, the description is only an example of the invention's application and should not be taken as a limitation. In particular, even though much of preceding discussion was aimed at read and write operations having constant row line voltages, alternative embodiments of this invention reduce but do not eliminate fluctuations in the row line voltage. For example, the row line voltage for the verify cycle may equal the row line voltage for a read, and the row line voltage for a program cycle may depend on the data value being written. In such an embodiment of the invention, the variable biasing of the selected column line still reduces the fluctuation in the row line voltage. Accordingly, variations of operating voltages and overall noise decrease, and the accuracy of read and write operations improves. Various other adaptations and combinations of features of the embodiments disclosed are within the scope of the invention as defined by the following claims.

What is claimed is:

1. A read operation for a memory, comprising:
biasing a selected row line at a first voltage, wherein the selected row line is coupled to a control gate of a selected memory cell, and the first voltage is higher than any threshold voltage used to represent data in the memory;

connecting a sense amplifier to a selected column line that is coupled to the selected memory cell;

applying a selected load to the selected column line;

determining a state of the sense amplifier while the selected row line is at the first voltage and the selected load is applied to the selected column;

in response to the sense amplifier having a first state, changing the selected load and repeating the applying and determining steps; and in response to the sense amplifier having a second state, generating a read value for the selected memory cell according to the selected bias.

2. The read operation of claim 1, wherein:

the first state arises when current through the selected memory cells trips the sense amplifier; and the second state arises when the current through the selected memory cells fails to trip the sense amplifier.

3. The read operation of claim 1, wherein:

the first state arises when current through the selected memory cells fails to trip the sense amplifier; and the second state arises when the current through the selected memory cells trips the sense amplifier.

4. The read operation of claim 1, further comprising keeping the selected row line at the first voltage throughout the read operation.

5. The read operation of claim 1, wherein changing the selected load comprises repeating the determining and changing steps as required to perform a binary search for a load corresponding to a trip point of the sense amplifier.

6. The read operation of claim 1, wherein the first voltage is equal to a voltage applied to the selected row line when writing a data value.

7. The read operation of claim 6, wherein the data value corresponds to a threshold voltage that is lowest of any threshold voltage representing stored data values.

8. A read operation for a memory, comprising:

biasing a selected row line at a first voltage, wherein the selected row line is coupled to a control gate of a selected memory cell, and the first voltage is higher than any threshold voltage used to represent data in the memory;

connecting a sense amplifier to a selected column line that is coupled to the selected memory cell;

applying a selected load to the selected column line;

determining a state of the sense amplifier while the selected row line is at the first voltage and the selected load is applied to the selected column;

in response to the sense amplifier having a first state, changing the selected load and repeating the applying and determining steps, wherein changing the selected load comprises operating a counter that provides a count signal as a control signal for a variable load; and in response to the sense amplifier having a second state, generating a read value according to the selected bias.

9. The read operation of claim 8, further comprising repeating the determining and changing steps m times, wherein m is the number of bits in the control signal.

10. The read operation of claim 9, wherein operating the counter comprises:

selecting a steps size for the counter according to the number of previous repetitions of the changing step; and selecting whether to count up or down according to the result of a preceding repetition of the determining step.

11. A memory comprising:

a memory array including rows and columns of memory cells, wherein each row of the array has a row line coupled to memory cells in the row, and each column has a column line coupled to memory cells in the column;

a column decoder coupled to the column lines of the memory array;

a first variable load between the column decoder and a source of a first voltage; and a counter coupled to the first variable load, wherein a count signal from the counter controls the first variable load.

12. The memory of claim 11, further comprising a converter coupled to the counter, wherein for a read operation, the converter converts the count signal to a multibit data value for output as a value read from a selected memory cell.

13. The memory of claim 11, further comprising:

a second variable load between the column decoder and a source of a second voltage; and a control circuit that applies the second voltage through the second variable load to the column decoder during a write operation, and applies the first voltage through the first variable load to the column decoder during a read operation.

14. The memory of claim 13, wherein the control circuit applies the second voltage through the second variable load to the column decoder during program cycles of the write operation and applies the first voltage through the first variable load to the column decoder during verify cycles of the write operation.

15. The memory of claim 11, further comprising:

a source of a second voltage that is greater than any threshold voltage used to represent data stored in the memory; and a row decoder coupled to the source of the second voltage and to the row lines of the memory array, wherein the row decoder applies the second voltage to a selected row line throughout a read operation.

16. The memory of claim 15, wherein the row decoder applies the second voltage to a selected row line throughout a write operation.

17. The memory of claim 15, further comprising a voltage shifter that provides a programming signal having a voltage level that depend on a data value being written during a write operation, wherein the row decoder applies the programming signal to a selected row line throughout the write operation.

18. The memory of claim 15, further comprising:

a sense amplifier, wherein the column decoder connects the first variable load and the sense amplifier to a selected column line for a read operation; and a read circuitry that operates the counter to change the first variable load during the read operation and that generates a read value from a count selected from the counter according a state of the sense amplifier.

19. The memory of claim 18, further comprising a converter coupled to the counter, wherein for the read operation, the converter converts the count signal to a multibit data value for output as a value read from a selected memory cell.

20. The memory of claim 19, wherein the converter further comprises a volatile memory for storing counts from the counter, wherein each count corresponds to a reference cell and is a value of the count signal at a trip point of the sense amplifier when the sense amplifier is coupled to the reference cell.

21. A write operation for a non-volatile multi-level memory, comprising:

(a) applying a programming pulse to a selected memory cell to change a threshold voltage of the selected memory cell;

(b) sensing a state of a sense amplifier connected to the selected memory cell when the selected memory cell is biased for sensing;

(c) repeating the applying and sensing steps until the sensing first determines the sense amplifier has a first state;

(d) sensing the state of the sense amplifier again to confirm the first determination whether the sense amplifier had the first state;

(e) in response to failing to confirm, applying a further programming pulse to the selected memory cell to change the threshold voltage of the selected memory cell; and (f) in response to confirming the first determination, ending the write operation.

22. The method of claim 21, further comprising repeating steps (d) and (e) until step (d) confirms the sense amplifier has the first state.

23. The method of claim 21, wherein the programming pulse of step (e) has parameters that minimize change in the threshold voltage of the selected memory cell caused by the programming pulse of step (e).

24. The method of claim 23, wherein the programming pulse of step (e) has a minimum pulse-width.

25. The method of claim 23, wherein the programming pulse of step (e) has a minimum programming current.

26. A write operation for a multi-bit-per-cell non-volatile memory, comprising:

biasing a selected row line at a first voltage, wherein the selected row line is coupled to a control gate of a selected memory cell;

performing a programming operation by connecting a first load to a selected column line, wherein the selected column line is coupled to the selected memory cell and the first load provides a programming current that changes a threshold voltage of the selected memory cell during the programming operation;

selecting a second load that corresponds to a multi-bit value that the write operation writes in the selected memory cell;

performing a verify operation that comprises: connecting the second load and a sense amplifier to the selected column line, wherein the selected row line remains at the first voltage during the verify operation; and determining a state of the sense amplifier while the selected row line is at the first voltage and the second load is connected to the selected column;

in response to the sense amplifier having a first state during the verify operation, repeating the programming operation and the verify operation; and ending the write operation in response to the sense amplifier having a second state during the verify operation.

27. A multi-bit-per-cell memory comprising:

a memory array including rows and columns of memory cells, wherein each row of the array has a row line coupled to memory cells in the row, and each column has a column line coupled to memory cells in the column;

a column decoder coupled to the column lines of the memory array;

a first variable load coupled to the column decoder;

a sense amplifier coupled to the column decoder; and a control circuit connected to the first variable load, wherein for a write operation, the control circuit receives a multibit value to be written in a selected memory cell and controls the first variable load to bias a selected column line for a verify cycle of the write operation, the control circuit controlling the first variable load so that a trip point of the sense amplifier during the verify cycle depends on the multibit value.

28. The memory of claim 27, further comprising a second load coupled to the column decoder, wherein the second load provides a programming current to change a threshold voltage of the selected memory cell during a program cycle.

* * * * *